(12) United States Patent
Man et al.

(10) Patent No.: US 9,294,118 B2
(45) Date of Patent: Mar. 22, 2016

(54) MULTI-INPUT ANALOG-TO-DIGITAL CONVERTER

(71) Applicant: ANALOG DEVICES, INC., Norwood, MA (US)

(72) Inventors: Guanghua Man, Greensboro, NC (US); Joseph B. Brannon, Greensboro, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 137 days.

(21) Appl. No.: 14/167,002

(22) Filed: Jan. 29, 2014

(65) Prior Publication Data

US 2015/0214973 A1    Jul. 30, 2015

(51) Int. Cl.
*H03M 1/60* (2006.01)
*H03M 1/12* (2006.01)
*H04W 88/08* (2009.01)

(52) U.S. Cl.
CPC ............. *H03M 1/60* (2013.01); *H03M 1/122* (2013.01); *H03M 1/1245* (2013.01); *H04W 88/08* (2013.01)

(58) Field of Classification Search
CPC ..... H03M 1/60; H03M 1/122; H03M 1/1245; H04W 88/08
See application file for complete search history.

(56) References Cited

U.S. PATENT DOCUMENTS

| | | | | |
|---|---|---|---|---|
| 2006/0211398 A1* | 9/2006 | Wolf | ........................ | H04B 1/28 455/323 |
| 2009/0171602 A1* | 7/2009 | Hong | .................. | G01R 31/2837 702/65 |
| 2010/0087227 A1 | 4/2010 | Francos et al. | | |
| 2012/0087257 A1 | 4/2012 | Larsson et al. | | |
| 2012/0269245 A1* | 10/2012 | Mehrmanesh | ..... | H04B 17/0085 375/224 |
| 2013/0044686 A1 | 2/2013 | Yen | | |
| 2013/0154725 A1* | 6/2013 | Huang | .................. | H03H 19/004 327/552 |
| 2013/0156134 A1 | 6/2013 | Galan et al. | | |
| 2013/0188756 A1 | 7/2013 | Sundström et al. | | |
| 2013/0230080 A1 | 9/2013 | Gudem et al. | | |
| 2013/0322575 A1 | 12/2013 | Muquet et al. | | |
| 2014/0028395 A1* | 1/2014 | Chan | ....................... | H03F 3/005 330/260 |
| 2014/0072071 A1* | 3/2014 | Berlin | .................... | H04B 7/022 375/267 |
| 2014/0079098 A1* | 3/2014 | Harjani | .................. | H04B 1/001 375/219 |
| 2014/0085117 A1* | 3/2014 | Hurrell | ............... | H03M 1/1245 341/122 |
| 2015/0049841 A1* | 2/2015 | Laporte | ................ | H04B 1/0475 375/297 |

FOREIGN PATENT DOCUMENTS

WO    00/11800    3/2000

OTHER PUBLICATIONS

Partial European Search Report issued in EP Application Serial No. 15151665.5 mailed Jul. 2, 2015, 7 pages.

* cited by examiner

*Primary Examiner* — Bobbak Safaipour
(74) *Attorney, Agent, or Firm* — Patent Capital Group

(57) ABSTRACT

In an example, there is disclosed a multiple-input analog-to-digital converter configured to receive a plurality of analog inputs and to output one or more digital outputs. In one embodiment, two input analog signals are received. The two analog signals may be mixed in a combiner, which provides them to a pipeline ADC. In another embodiment, the combiner may time multiplex the two analog input signals and provide two separate outputs signals. Advantageously, the multiple-input ADC of the present Specification may be realized with a single ADC pipeline.

22 Claims, 8 Drawing Sheets

MULTI-INPUT ANALOG-TO-DIGITAL CONVERTER

FIELD OF THE DISCLOSURE

This application relates to the field of microelectronics, and more particularly to a multiple-input digital-to-analog converter.

BACKGROUND

Carrier aggregation (CA) is a method used by telecommunication devices to increase bandwidth, for example in 4G LTE (Long-Term Evolution) devices. CA comprises aggregation of two or more component carriers (CC), with one example allowing up to five CCs. By aggregating a plurality of CCs, greater overall bandwidth may be realized. For example, with five CCs at 20 MHz each, an overall bandwidth of approximately 100 MHz is possible. For a telecommunications service provider that does not own a full 100 MHz of contiguous bandwidth, this may enable an overall 100 MHz bandwidth. Three example modes may be provided. These include contiguous, non-contiguous, and intra-band aggregation.

CA does not affect the full protocol stack, however. Rather, one CC may be designated as a primary, and the additional CCs may then be treated as extra transmission resources. Therefore, CA signaling is transparent, for example, to Packet Data Convergence Protocol (PDCP and Radio Link Control (RLC)) layers. The Medium Access Control (MAC) layer may provide logic to multiplex a plurality of CCs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF THE EMBODIMENTS

Overview

Figure 1:
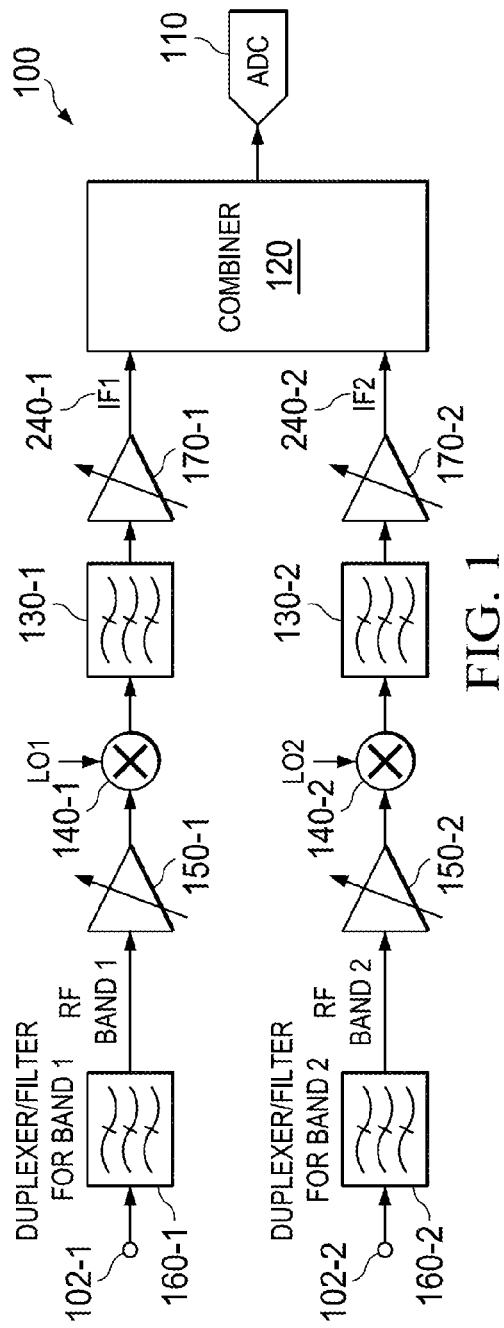
FIG. 1 is a block diagram of a multiple-input ADC according to one or more examples of the present Specification.

In an example, there is disclosed herein a multiple-input analog-to-digital converter configured to receive a plurality of analog inputs and to output one or more digital outputs. In one embodiment, two input analog signals are received. The two analog signals may be mixed in a combiner, which provides them to a pipeline ADC. In another embodiment, the combiner may time multiplex the two analog input signals and provide two separate outputs signals. Advantageously, the multiple-input ADC of the present Specification may be realized with a single ADC pipeline One embodiment includes a multiple-input analog-to-digital converter (ADC) comprising a plurality of n receivers configured to receive n input bands; a mixer circuit configured to convert the n input bands to n intermediate frequency (IF) domain bands; a combiner configured to combine at least two IF domain bands into a single IF domain input; and a converter element configured to convert the single IF domain input into a digital output.

Another embodiment includes combiner for a multiple-input analog-to-digital converter, comprising a first switch network configured to receive a first input signal from one of the n input bands; a second switch network configured to receive a second input signal from another of the n input bands; a first sampling capacitor network configured to receive the first input signal from the first switch network and convert the first input signal to a first charge domain input; a second sampling capacitor network configured to receive the second input signal from the second switch network and convert the second input signal to a second charge domain input; an amplifier configured to drive a single analog output; and a feedback capacitor network disposed in a feedback configuration with the amplifier and configured to receive the first and second charge domain inputs; wherein the amplifier is further configured to convert the first and second charge domain inputs into a the single analog output.

Yet another embodiment includes a method performed by a multiple-input analog-to-digital converter comprising converting a voltage-domain analog input signal to a charge domain; in the charge domain, charging a first sampling capacitor network and second sampling capacitor network; in the charge domain, transferring charge from the first and second sampling capacitor networks to a feedback capacitor network disposed in a feedback arrangement with an amplifier; and converting charge on the feedback capacitor network to a voltage-domain output signal.

Examples of the Disclosure

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed.

Different embodiments may have different advantages, and no particular advantage is necessarily required of any embodiment.

The International Telecommunication Union (ITU) provides a radio frequency (RF) allocation table, which provides that the maximum bandwidth of a single RF band may be up to 200 MHz. This value is provided by way of example only, and should not be construed as limiting. Rather, it is provided to illustrate a useful example of an operating environment in which the disclosure of the present Specification may be used, namely one in which a single RF band of no more than 200 MHz is available.

In an example of the present Specification, a dual-band radio may be provided to enable operation in CA environments. It is anticipated that many dual-band wireless devices will be introduced in the future, as LTE, and consequently CA, gain even wider adoption.

In an example dual-band radio spectrum, each RF band is limited by the bandwidth defined by ITU. The combination of the two RX (receive) bands may be, for example, up to 294 MHz (band 40+band 41). There may be a TX (transmit) band sitting between the two RX bands so the contiguous bandwidth across the whole two RX bands is maintained. This is because the maximum frequency of two RX bands minus the minimum frequency of the two RX bands is greater than the combined bandwidth of two RX bands, which is up to 390 MHz.

In an example architecture of the present Specification, two separate bands are received in two separate RF chains in a super heterodyne configuration, including two separate mixers and local oscillators (LOs). Thus, the usable bandwidth of an ADC disposed therein would be greater than the sum of the two RX bandwidths plus a certain guard band for isolation purposes. One advantage of this architecture is low technical risk since each of the bands may provide adequate filtering on RF and/or IF stages.

To further save hardware cost, an alternative embodiment may combine two RX signals in the RF domain. This architecture may require the ADC sample rate to be relatively high, as the required ADC bandwidth may be much greater than the sum of the two RX bandwidths. In this architecture, the two RX signal share most of the RF chain and all of the IF chain, facilitated by higher linearity on active components.

Turning now to the attached FIGURES, FIG. 1 is a block diagram of a super heterodyne receiver 100, including an ADC 110 configured to operate in a summing configuration according to one or more examples of the present Specification.

Figure 5:
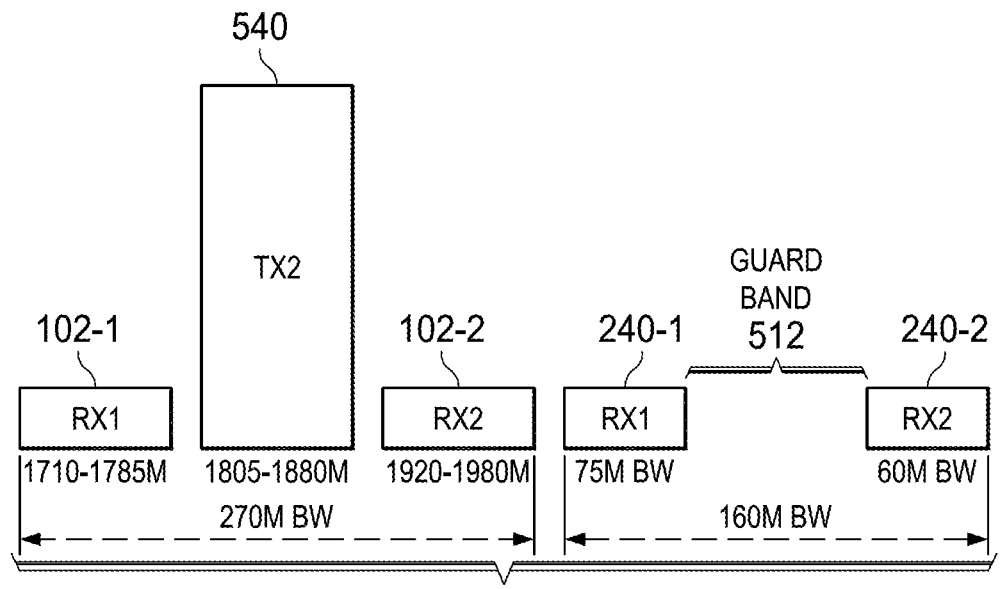
FIG. 5 is a block diagram representation of an aggregated signal sampled in the intermediate voltage domain according to one or more examples of the present Specification.

In this example, two antennae 102-1 and 102-2 are configured to receive dual-band radio frequency (RF) signals, for example, in a CA configuration. Each RF signal is provided to a duplexer/filter 160-1 and 160-2, both of which are configured to filter out unwanted frequencies and noise. The resulting RF signals are provided to amplifiers 150-1 and 150-2, which boosts the RF signals. Blocks 140-1 and 140-2 are RF mixers, which receive an RF input as well as a local oscillator (LO) clock signal, which they mix with the RF signal to create a clocked intermediate frequency (IF) signal. In an example, LO clock signals LO1 and LO2 are provided in two separate frequency bands, for example separated by 110 MHz (chosen by way of example to be 270 MHz-160 MHz, as illustrated in FIG. 5).

The IF signals are provided to IF filters 130-1 and 130-2, which are configured to filter unwanted noise and signal components. The two IF signals, IF1 240-1 and IF2 240-2, may then be combined in combiner 120. Combiner 120 may be configured to mix, interleave, or multiplex IF signals IF1 and IF2 by way of non-limiting example. In an embodiment, combiner 120 is configured to sum IF1 240-1 and IF2 240-2, and then to provide the summed output to ADC 110. ADC 110 may be configured as a single-analog-input, multiple-digital-output ADC. In one example, ADC 110 provides two channels of the summed IF signal as two separate outputs.

Figure 2:
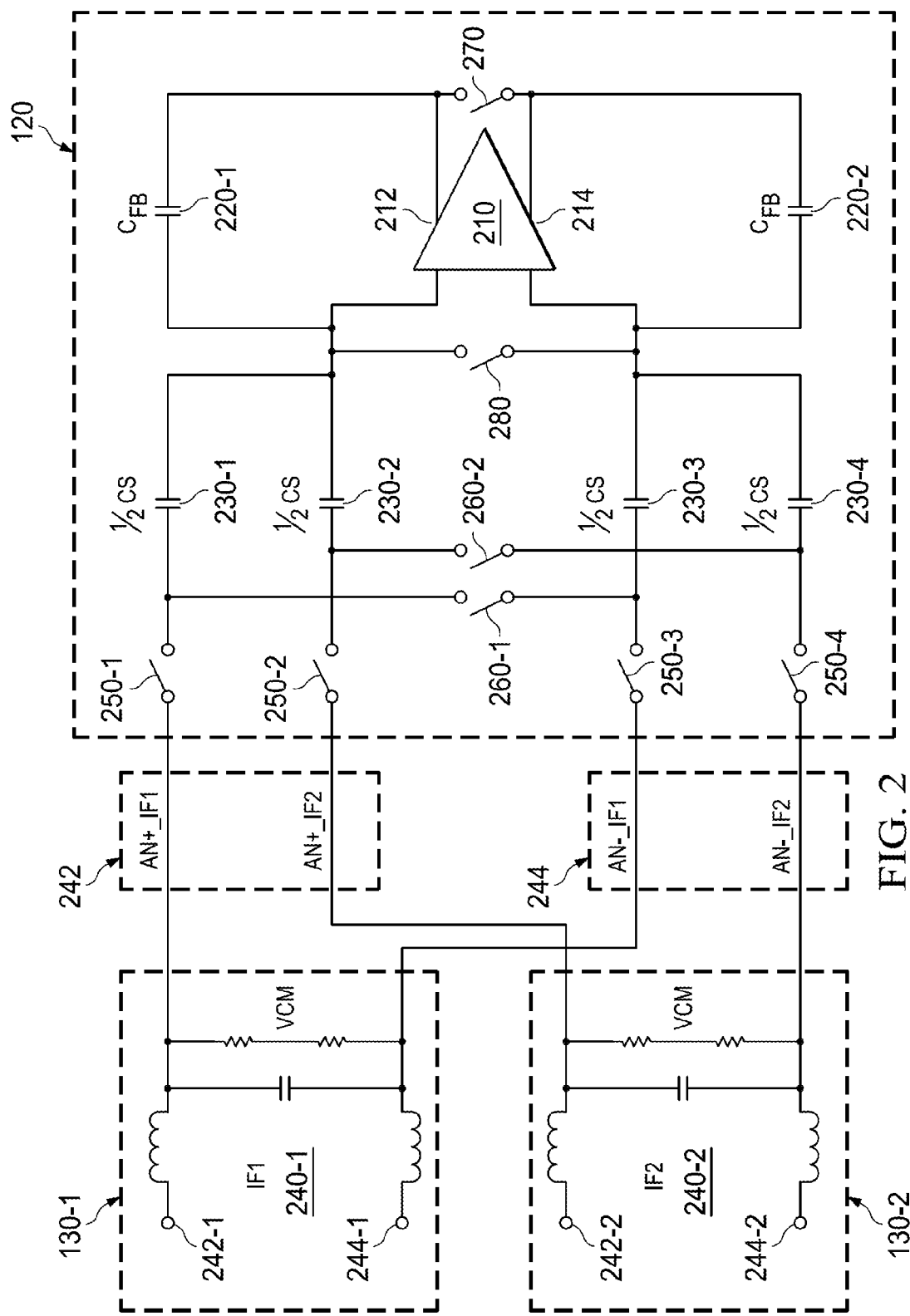
FIG. 2 is a block diagram of a combiner circuit for use with a multiple-input ADC according to one or more examples of the present Specification.

FIG. 2 is a block diagram of selected elements of FIG. 1 according to one or more examples of the present Specification. In particular, FIG. 2 discloses additional details of IF filters 130, and combiner 120. IF filters 130-1 and 130-2 receive signals IF1 and IF2 respectively. In an example, IF filters 130 each include a differential bypass filter for filtering out unwanted transients and noise. The filtered signals are then provided as differential component signals, namely signal IF1 is provided as AN+_IF1 and AN−_IF1, and signal IF2 is provided as AN+_IF2 and AN−_IF2. For ease of reference, AN+_IF1 and AN+_IF1 will be referred to hereafter as positive signal components 242, comprising AN+_IF1 242-1 and AN+_IF2 242-2, while AN−_IF1 and AN−_IF2 will be referred to hereafter as the negative signal components 244, comprising AN+IF1 244-1 and AN+IF2 244-2.

In the disclosed example, input signals IF1 240-1 and IF2 240-2 are sampled in charge domain. Combiner 120 receives positive signal components 242 and negative signal components 244 as inputs. In an example, a plurality of select switches 250 are provided to enable selection of input signals. A charge switch 280 and discharge switches 260 together control charging of sample capacitors (Cs) 230 from input signals 240, and transferring of charge from Cs 230 to feedback capacitors (Cfb) 220. A sample-and-hold amplifier (SHA) amplifies a voltage corresponding to the charge on Cfb capacitors 220 and provides the voltage at its output terminals.

In this Specification, a "switch" includes any electrical or mechanical device that selectively permits or impedes flow of electrical current or electrical signals. A switch includes, by way of non-limiting example, a mechanical switch, electromechanical switch, relay, microelectromechanical switch, transconductor, transistor, and triode. In an example, the switches disclosed throughout this Specification may be metal oxide semiconductor field-effect transistors (MOSFETs), and may be controlled by an electronic controller such as controller 480 of FIG. 4. For simplicity, controller 480 is not shown in this view, and individual connections to switches are not shown. It should be noted, however, that each switch may be communicatively coupled to and controlled by a controller such as controller 480. In this context, it should also be understood that "opening" a switch may comprise, for example, applying at a first node a current or voltage selected to impede current flow between a second and third node, while "closing" a switch may comprise applying at the first node a current or voltage selected to permit current flow between the second and third node.

The embodiment of FIG. 2 may be particularly appropriate for carrier aggregation (CA) processing, as the two input signals represent a single bandwidth spread across two or more sub-spectra.

This configuration splits sample capacitors (Cs) 230 into two sets with one-half capacitance each. In principle, the input signal is converted from the voltage domain to the charge domain, and simultaneously charges two sample capacitor sets (230-1 and 230-3 in one set; 230-2 and 230-4 in the second set), each with a capacitance of ½ Cs. The charge on the Cs capacitors is then transferred to feedback capacitor Cfb 220, which drives SHA 210. SHA 210 converts the signal back to the analog voltage domain, and the output may be used to drive an ADC pipeline as in FIG. 1. In this example, the sample capacitance is reduced by a factor of two, meaning that the kTC noise floor may rise by 3 dB.

In an example, the equivalent sample rate for each analog input (virtual ADC channel) is equivalent to the core sample rate Fs. However, the full scale input of each analog input signal may be reduced by a factor of 2 (6 dB) worst-case so that the signal-to-noise ratio (SNR) of each virtual ADC channel may be degraded by 6 dB, without a change to the noise density.

In yet another embodiment, the number of input channels may be increased to n, by sampling across n sets of Cs capacitors 230. Each capacitor may have a capacitance of 1/n Cs, thus providing n virtual channels. In this case, the full-scale input of each analog input channel may be reduced by a factor of n worst-case so that the SNR of each virtual ADC channel may be reduced by 20*log(n). As n increases, designs may need to compensate for a degraded SNR.

Figure 3:
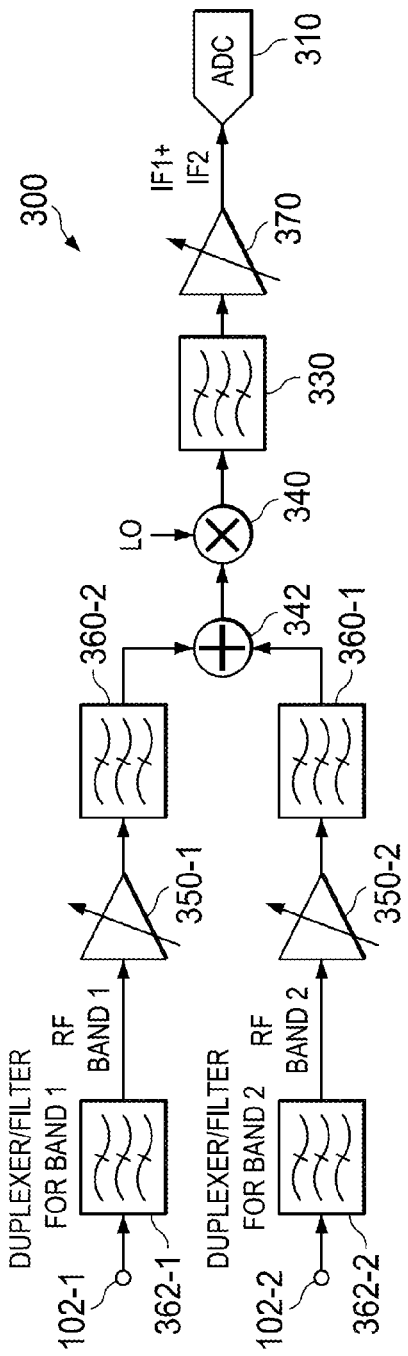
FIG. 3 is a block diagram of another embodiment of a multiple-input ADC according to one or more examples of the present Specification.

FIG. 3 is a block diagram of a dual-input ADC according to one or more examples of the present Specification. As with the embodiment disclosed in connection with FIG. 1, this FIGURE represents a super heterodyne configuration with two inputs representing, for example, two CA bands. In the example of FIG. 3, however, input signals 102-1 and 102-2 are combined in the RF domain rather than in the IF domain.

As in FIG. 1, two input signals 102-1 and 102-2 are received. A pair of RF duplexers/filters 362-1 and 362-2 filters the signals in the RF domain for unwanted noise and transients. A pair of RF amplifiers 350-1 and 350-2 amplifies each input signal 102.

The amplified signals are again filtered in the RF domain by RF filters 360-1 and 360-2. The two signals then enter RF combiner 342, which may be, for example passive combiners such as resistive combiners or transmission line Wilkinson combiners. Mixer 340 then mixes the combined signal with a local oscillator to create a single IF domain signal. The combined signal is amplified by amplifier 370. Finally, the fully-conditioned, combined signal IF1+IF2, is provided to ADC 310.

In some embodiments, ADC 310 may be a standard single-input, single-output pipeline ADC. In other embodiments, ADC 310 may also provide multiple bands of output, similar to ADC 110.

The upconverting and downconverting of the present Specification, particularly in reference to FIGS. 1 and 3, may be part of a heterodyne operation, and may be performed in whole or in part by RF mixers 140 and 340. Heterodyning, in a generic sense, is a well-established technique useful for combining two different RF signals, and in this case may be used, for example to frequency shift the input RF signals into a usable frequency band. Thus, in certain embodiments, the teachings of this Specification may advantageously provide novel and substantial improvements to established heterodyne techniques, such as handling multiple analog inputs on a single semiconductor microelectronic circuit with reduced surface area.

Figure 4:
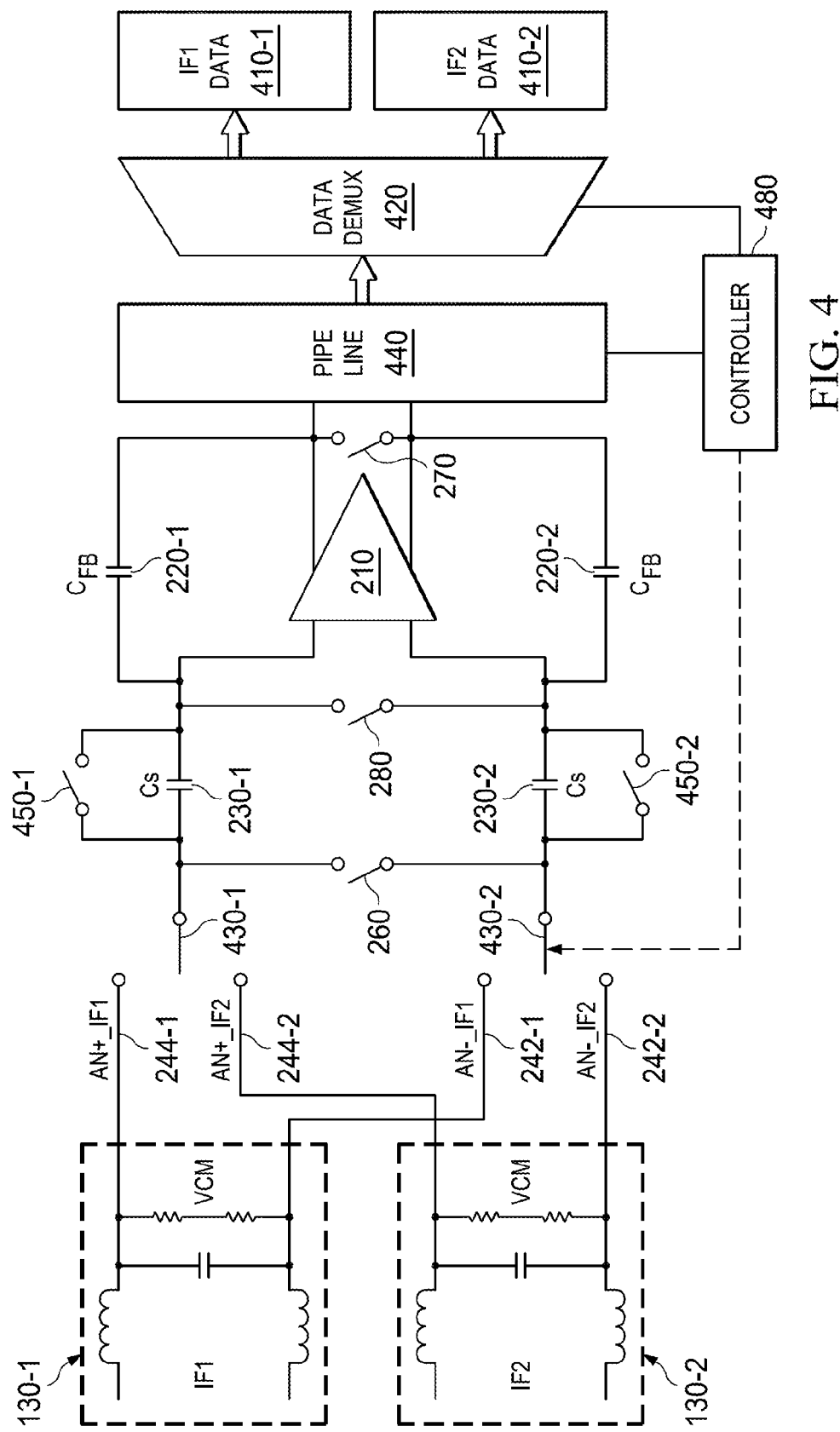
FIG. 4 is a block diagram of another embodiment of a combiner circuit for use with a multiple-input ADC according to one or more examples of the present Specification.

FIG. 4 is a second example of a combiner 120 according to one or more aspects of the present Specification. The circuit of FIG. 4 may be embodied, in various configurations, as an electronic circuit with discrete mixed-signal components, as a semiconductor-based discrete microelectronic circuit such as an integrated circuit, or as a part thereof, such as an embedded RF receiver provided as part of a digital signal processor (DSP), among many other possible configurations.

As with the example of FIG. 2, the combiner of FIG. 4 receives IF1 240-1, and IF2 240-2. Each signal is filtered by filter 130, and broken into component parts labeled as positive signal component 242 and negative signal component 244. In this case, two Cs capacitors, each having the full Cs value, are provided.

In this case, only a single charge switch 280 and discharge switch 260 are provided. Multiplexing is handled by select switches 430. Each select switch 430 may be a single-pole, double-throw switch. Switching is controlled by controller 480. Controller 480 may include any microcontroller, microprocessor, digital signal processor, graphics processing unit, field-programmable gate array, application-specific integrated circuit, programmable logic device, or any other species of processor or programmable logic device. In some cases, controller 480 may be dedicated logic provided specifically for controlling a combiner 120, while in other cases, controller 480 may be a general-purpose processor communicatively coupled to a memory having stored therein executable instructions operable to instruct processor 480 to carry out methods, such as the methods disclosed in this Specification.

In an example, controller 480 controls all of the switches disclosed in this Specification, including for example switches 270, 280, 430, 440, and 450, as well as data demultiplexer 420. Controller 480 may also be a standard controller for a typical pipeline ADC. Controller 480 may be part of an integrated circuit, such as an on-chip controller, rather than a separate or discrete controller, and it should be noted that the broad scope of this Specification is intended to encompass any such configuration.

As with the switches of FIG. 2, select switches 430 maybe any type of suitable switch. In an example, select switch 430-1 and 430-2 are switched in tandem with each other. This allows mutually exclusive selection of either IF1 240-1 or IF2 240-2.

In this example, selection of the two signals is time multiplexed. Thus, in some embodiments, a discharge switch 450 may be provided to improve isolation performance of virtual channels, in contrast to some other multi-channel ADCs, which may provide physical isolation between multiple analog channels. Discharge switch 450 may be closed by controller 480 to short the two terminals of CS capacitors 230. This process, known as a "memory effect removal function," effectively discharges any charge stored on CS capacitors 230.

In an example, select switches 430-1 and 430-2 may be moved to the upper position to select input signal IF1. Charge switch 280 may be closed, while discharge switch 260 may remain open. This allows Cs capacitors 230 to charge. Once Cs capacitors 230 are charged, charge switch 280 may be opened, and discharge switch 260 may be closed. This allows the charge to accumulate on Cfb capacitors 220.

To select the signal from IF2, Cs capacitors 230 are first cleared by closing discharge switches 450. Select switches 430-1 and 430-2 are then moved to their lower position to select signal IF2. The process is then repeated.

As with FIG. 2, SHA 210 amplifies the signal cumulated on CFB capacitors 220. The amplified signal may then be provided to an ADC, such as pipeline 440. Pipeline 440 may provide two channels of output. A data demultiplexer 420 may receive the two channels, with selection controlled by controller 480. Thus, using the combiner of FIG. 4, separate IF1 data 410-1 and IF2 data 410-2 may be provided.

SHA 210 has an output switch 270 connected across its output terminals. Output switch 270 can be used to selectively either short the output terminals together so that there is no potential difference across them, or to leave an open circuit between them so that there is a valid potential difference. When output switch 270 is open, SHA 210 provides its analog output to pipeline 440, and when output switch 270 is closed, SHA 210 provides no input to pipeline 440. Pipeline 440 is disclosed by way of non-limiting example only, and it should be noted that any suitable type of analog-to-digital conversion core circuit may be used.

Figure 7:
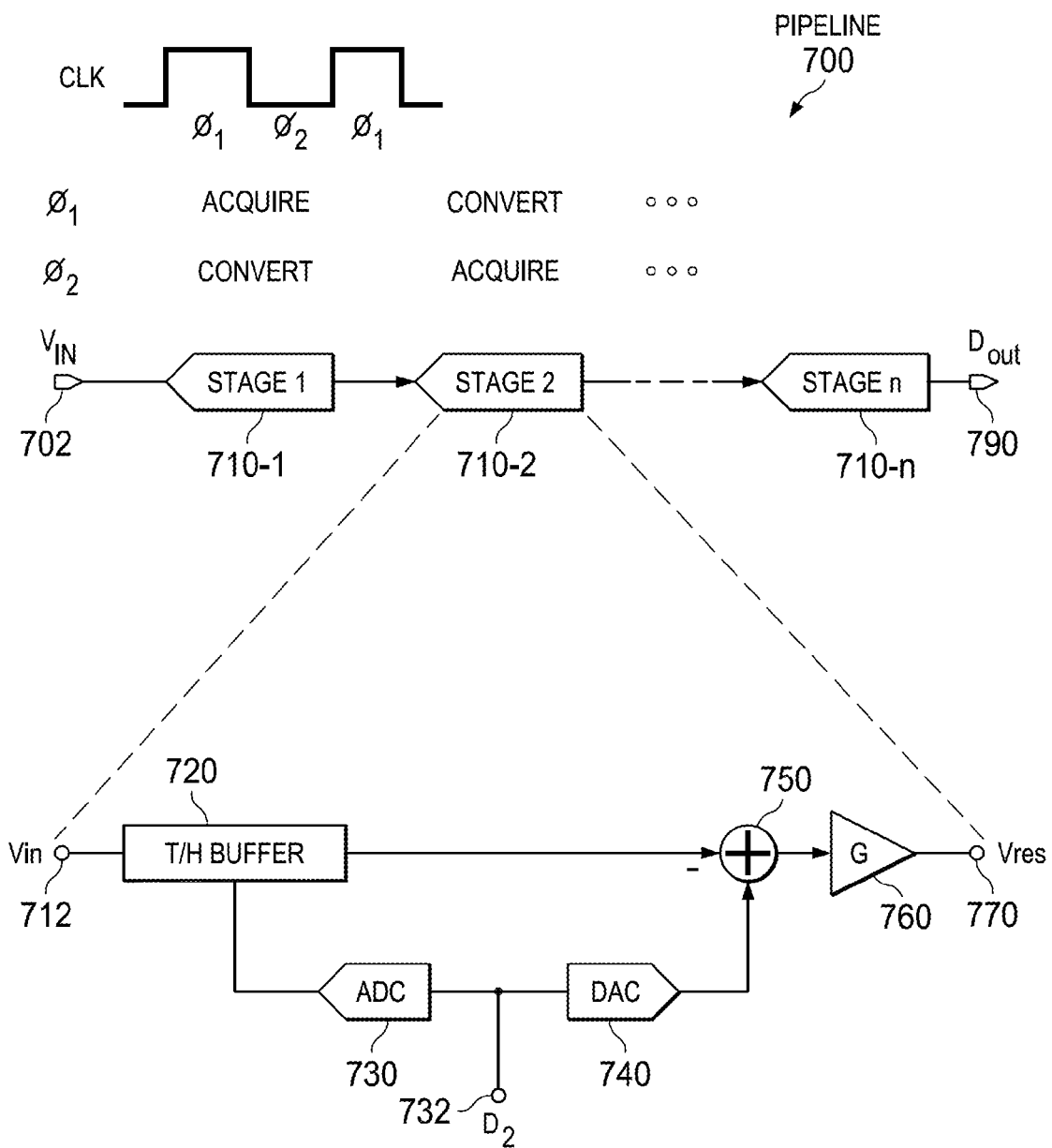
FIG. 7 is a block diagram of an analog-to-digital converter core according to one or more example embodiments of the present Specification.

In an example, pipeline 440 may be a pipeline such as the one disclosed in FIG. 7. Pipeline 440 may be configured to provide to data demultiplexer 420 a single digital output at each time unit. Data demultiplexer 420 receives a control signal from controller 480, and selects either IF1 data 410-1, or IF 2 data 410-2. In operation of an example embodiment, only one of the foregoing may be provided at a time. This corresponds to the design of the present example, wherein select switches select either IF1 430-1, or IF2 430-2 at one time, but not both. Thus, this example provides time multiplexing of the input signals, and more specifically, a 2:1 time multiplexer switching between two analog inputs. Each analog input, in its turn, is selected and in the charge domain charges sampling capacitors Cs. The charge on Cs is then transferred to feedback capacitors Cfb. As in FIG. 2, Cfb drives the inputs of SHA 210, which converts the signal back to the voltage domain and amplifies it. Finally, the output of SHA 210 is converted to digital. Controller 480 then instructs data demultiplexer 420 to select either IF1 data 410-1 or IF2 data 410-2, depending on which position controller 480 selected for select switches 430-1 and 430-2.

This example may be functionally equivalent to having two virtual ADC channels, with each channel operating at one-half the sample clock rate. This may raise NSD by 3 dB compared to a dual-channel ADC with true dual analog inputs and a dual exclusive pipeline. In some embodiments, it may also be desirable to have "memory effect removal" functionality within ADC 110 for better channel isolation and better kick-back. The full scale input of each IF signal is equal to full-scale input on a single-input-single core ADC; thus, the SNR for each virtual channel may be the same as a physical dual-channel ADC, but with noise density degraded by 3 dB.

FIG. 5 is a block diagram representation of a dual-band input signal being mixed in the IF domain according to one or more examples of the present specification, and in particular showing an example that corresponds to FIG. 1. In this example, a first receiver band RX1 102-1 and a second receiver band RX2 102-2 are separated by a transmit band TX2 540. The total bandwidth across RF signals RX1 102-1 and RX2 102-2 is 270 MHz. As described in reference to FIG. 2, input RF signals 102-1 and 102-2 are filtered, down converted, and mixed with local oscillators LO1 and LO2, which in an example provide two different local clock frequencies separated by 110 MHz (270 MHz-160 MHz). In this example, a total 135 MHz is dedicated to receiving bands, with a 35 MHz guard band 512 between them. Thus, IF-domain RX1 240-1 is provided with 75 MHz bandwidth, and IF-domain RX2 240-2 is provided with 60 MHz bandwidth. In an example, transmit band TX2 540, is not present because it is rejected by filters 130-1 and 130-2. RX 1 240-1 and RX 2 240-2 may then be mixed in combiner 120 in the IF domain. Finally, they may be converted to digital by ADC 110.

Figure 6:
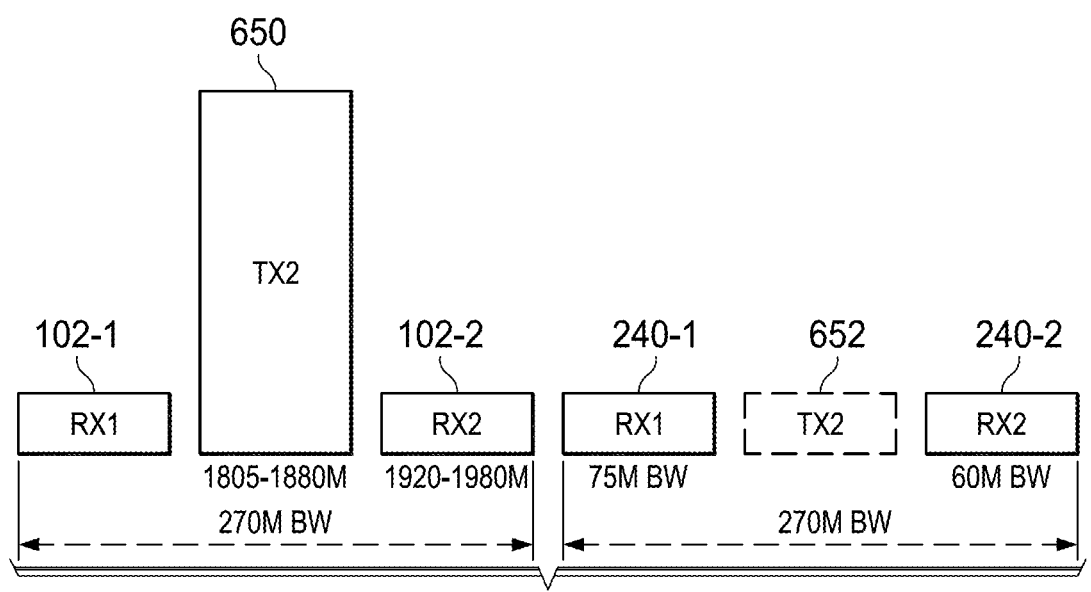
FIG. 6 is a block diagram of an aggregated signal sampled in the radio voltage domain according to one or more examples of the present Specification.

FIG. 6 is a block diagram representation of two input signals being mixed in the RF domain according to one or more examples of the present specification, and in particular disclosing an example that corresponds to FIG. 2. RX1 102-1 and RX-2 102-2 are separated by a transmit band TX2 650. A total of 270 MHz bandwidth is occupied, with 75 MHz for TX2 650.

Receiver bands RX1 102-1 and RX2 102-2 are 75 MHz and 60 MHz wide respectively. They are separated by transmit band TX2 650, which is 75 MHz wide. These may be provided to multiple-input ADC 300 of FIG. 3. Rather than being converted to the IF domain first and mixed in combiner 120, RX1 240-1 and RX2 240-2, separated by transit band 652, are mixed directly in the RF domain in summation block 342. The mixed signal is then converted the IF domain and provided to ADC 310, where it is converted to digital.

FIG. 7 is a block diagram of an example ADC core 700, such as ADC core 110 of FIG. 1 or ADC core 310 of FIG. 3. Pipeline 700 may include a plurality of stages 710-1-710-N. Pipeline 700 receives a voltage input 702, and outputs a digital output 790.

In an example, the pipeline stages may operate in two phases. Each phase may be divided into an acquire step and a convert step. A clock signal CLK is disclosed as an example. CLK is divided into a plurality of phases, with each phase being one of 2 species. Stage 1710-1, in phase $\phi 1$, acquires a signal. In phase $\phi 2$, stage I 710-1 converts the signal. Similarly, stage 2 710-2, in phase $\phi 2$, acquires a signal, and in phase $\phi 1$, converts the signal.

For reference, an exploded view of stage 2 710-2 is disclosed. It should be noted that in some embodiments, stage 2 710-2 may be representative of all other stages of pipeline 700. In this example, stage 2 710-2 includes a voltage input 712, which feeds into a transfer and hold buffer 720. Transfer and hold buffer 720 provides its output to a summing block 750 and to ADC 730. ADC 730 may be a simple or coarse ADC, such as a 1-bit ADC. Because pipeline 700 includes a plurality of stages, it is not necessary for each stage to provide a high-accuracy conversion of its input signal.

ADC 730 provides as its output signal D2 732, which may be summed with the output of each other stage to provide an overall digital output. ADC 730 also provides its output to DAC 740. DAC 740 converts D2 732 back to its analog form, where it is subtracted from the original Vin 712. This provides an indication of the difference between the output of ADC 740 and Vin 712. This difference is provided to gain amplifier 760, which provides it as a residual output 770. Residual voltage 770 is provided to the next stage.

Figure 8:
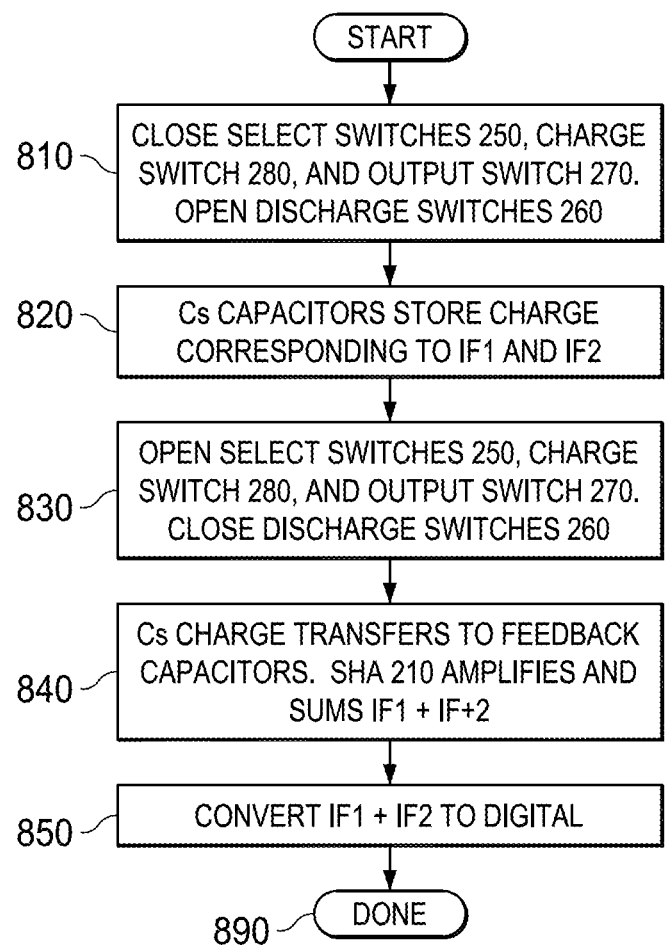
FIG. 8 is a flow diagram of a method of combining two analog input signals according to one or more examples of the present Specification.

FIG. 8 discloses a flow diagram of an example method of sampling two IF signals according to one or more embodiments of the present Specification. Throughout this Specification, certain steps may speak of "opening" or "closing" switches. It should be noted that this opening and closing may include leaving open a switch that is already open, or closing a switch that already closed. It should also be noted that the opening and closing action need not be taken by a human user, but rather may be performed by, for example, a controller. It should also be noted that the states of "open" and "closed" are used by convention only, and may refer, for example, to states in a solid-state device that impede or allow current flow respectively.

The method of FIG. 8 is performed by super heterodyne receiver 100 in one or more examples of the present Specification. The method of FIG. 8 focuses on steps performed by combiner 120 and ADC 110. Thus, for purposes of FIG. 8, it may be assumed that signals IF1 240-1 and IF2 240-2 have already been provided to combiner 120. The steps performed in FIG. 8 may be performed, for example, by a controller such as controller 480. In an example, executable instructions for carrying out the method of FIG. 8 may be stored on a non-transitory computer-readable medium, and may be operable to instruct controller 480 to carry out the method. The method of FIG. 8 may be considered a "parallel method," wherein IF1 and IF 2 are summed and converted in a single step.

In block 810, controller 480 may close select switches 250, charge switch 280, and output switch 270. Controller 480 may also open discharge switches 260. In block 820, this allows IF1 to accumulate as a charge difference between ½ CS 230-1 and ½CS 230-3. IF2 accumulates as a charge difference between ½ CS 230-2 and ½ CS 230-4. Once the charge has accumulated on CS capacitors 230, in block 830, controller 480 may open select switches 250, charge switch 280, and output switch 270. Simultaneously, controller 480 may close discharge switches 260. This transfers the charge from Cs capacitors 230 to feedback capacitors Cfb 220. The charge difference between Cfb 220-1 and Cfb 220-2 develops a potential difference between the input terminals of SHA 210. Thus, the potential difference across switch 270 represents the sum of input signals IF1 and IF2. In block 850, this signal is converted to digital form, for example by ADC 110.

Figure 9:
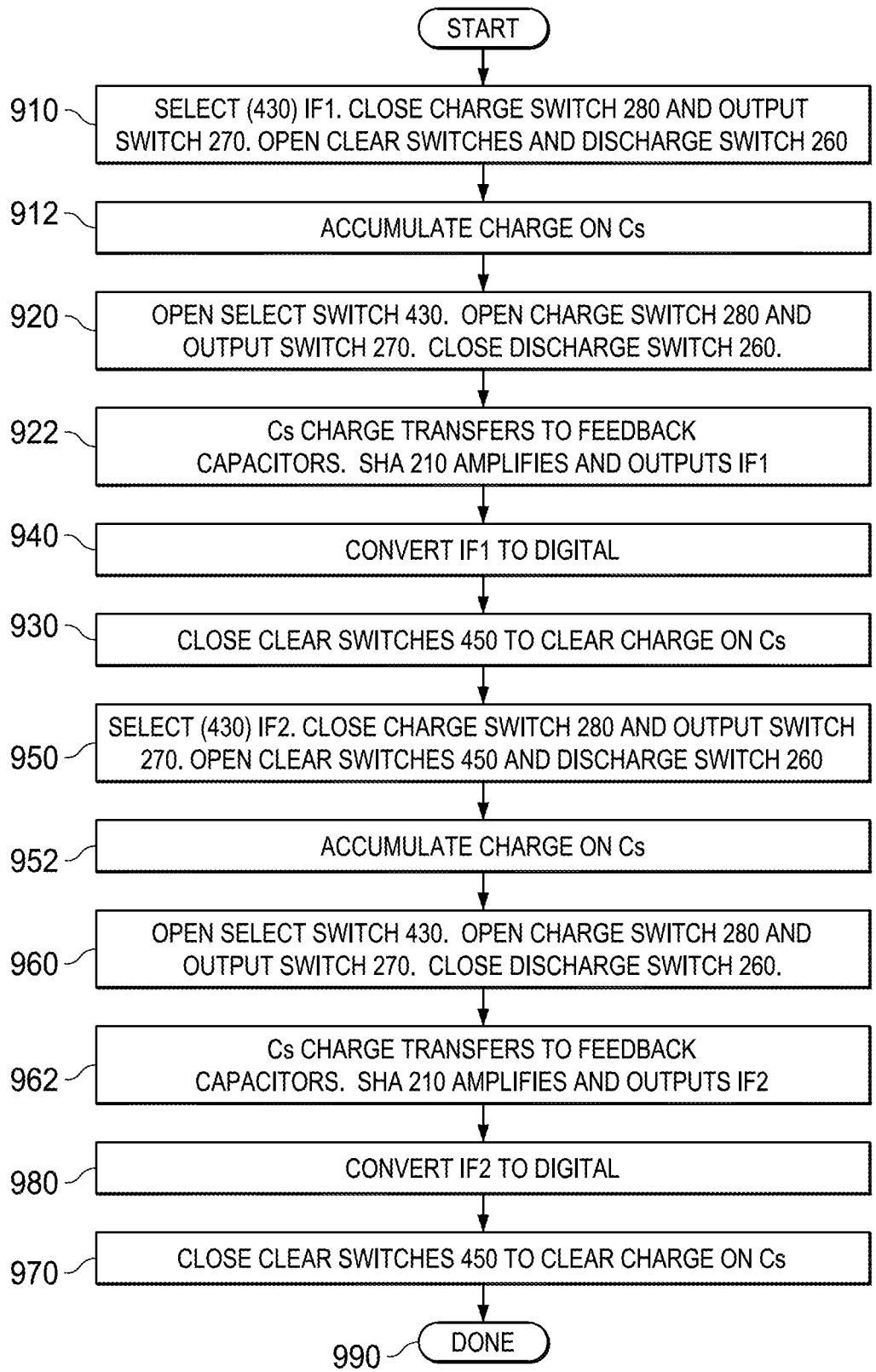
FIG. 9 is a flow diagram of another method of combining two analog input signals according to one or more examples of the present Specification.

FIG. 9 is a flow diagram of a method that may be performed by super heterodyne receiver 100, for example in conjunction with using a combiner 120 as disclosed in FIG. 4. This example may be considered a "serial method," wherein IF1 and IF2 are converted separately and provided as separate digital outputs. It should be appreciated that the methods of FIG. 8 and FIG. 9 provide different advantages from one another. Thus, it is anticipated that a skilled product designer will be able to select aspects of either method, as well as aspects of the combiners 120 disclosed in FIG. 2 and FIG. 4. By way of non-limiting example, the clear switches 450 of FIG. 4 may be used with select switches 250 of FIG. 2.

In block 910, controller 480 may select IF1 with select switches 430. Controller 480 may also close charge switch 280 and output switch 270. Controller 480 may also open clear switches 450 and discharge switch 260. In block 912, this allows a charge corresponding to IF1 to accumulate on sample capacitors 230.

In block 920, controller 480 may open select switch 430. It may also open charge switch 280 and output switch 270. Finally, controller 480 may close discharge switch 260.

In block 920, controller 480 may open select switch 430. Controller 480 may also open charge switch 280 and output switch 270. Finally, controller 480 may close discharge switch 260. In block 922, this allows the charge on sample capacitors Cs 230 to transfer to feedback capacitors Cfb 220. The accumulated charge may accrue at the inputs of SHA 210, which amplifies the input and develops a voltage difference across its output terminals. The output voltage across SHA 210 may be proportional to IF1. Because output switch 270 is open, the output appears as a valid difference in potential, which is provided to pipeline 440. Pipeline 440, controlled by controller 480, may convert the input signal to digital and provide its digital output to data demultiplexer 420. Controller 480 may also provide to data demultiplexer 420 a select signal, which selects either the output to IF1 data 410-1, or IF 2 data 410-2. In this case, controller 480 selects IF1 data 410-1.

In block 930, IF1 is converted to digital. In block 940, controller 480 may close clear switches 450. This will clear the charge on sampling capacitors CS 230. Sampling capacitors CS 230 is now ready to receive a new input.

In block 950, controller 480 may select IF2 with select switches 430. Controller 480 may also close charge switch 280 and output switch 270. Controller 480 may also open clear switches 450 and discharge switch 260. In block 952, this allows a charge corresponding to IF1 to accumulate on sample capacitors 230.

In block 960, controller 480 may open select switch 430. It may also open charge switch 280 and output switch 270. Finally, controller 480 may close discharge switch 260. In block 962, controller 480 may open select switch 430. Controller 480 may also open charge switch 280 and output switch 270. Finally, controller 480 may close discharge switch 260. This allows the charge on sample capacitors Cs 230 to transfer to feedback capacitors Cfb 220. The accumulated charge may accrue at the inputs of SHA 210, which amplifies the input and develops a voltage difference across its output terminals. The output voltage across SHA 210 may be proportional to IF2. Because output switch 270 is open, the output appears as a valid difference in potential, which is provided to pipeline 440. Pipeline 440, controlled by controller 480, may convert the input signal to digital and provide its digital output to data demultiplexer 420. Controller 480 may also provide to data demultiplexer 420 a select signal, which selects either the output to IF1 data 410-1, or IF 2 data 410-2. In this case, controller 480 selects IF2 data 410-2.

In block 970, IF1 is converted to digital. In block 980, controller 480 may close clear switches 450. This will clear the charge on sampling capacitors CS 230. Sampling capacitors CS 230 are now ready to receive a new input.

In block 990, the method is done.

In some cases, any of the ADCs of the present Specification may be implemented as, or as part of, an integrated circuit. Advantageously, a single core ADC of the present Specification with n analog inputs may be the functional equivalent of a virtual multiple-channel ADC. Compared to a true multi-channel ADC containing multiple single-analog-input-single-core ADC units, certain embodiments of the present Specification may realize significant savings in silicon surface area and power requirements.

Figure 10:
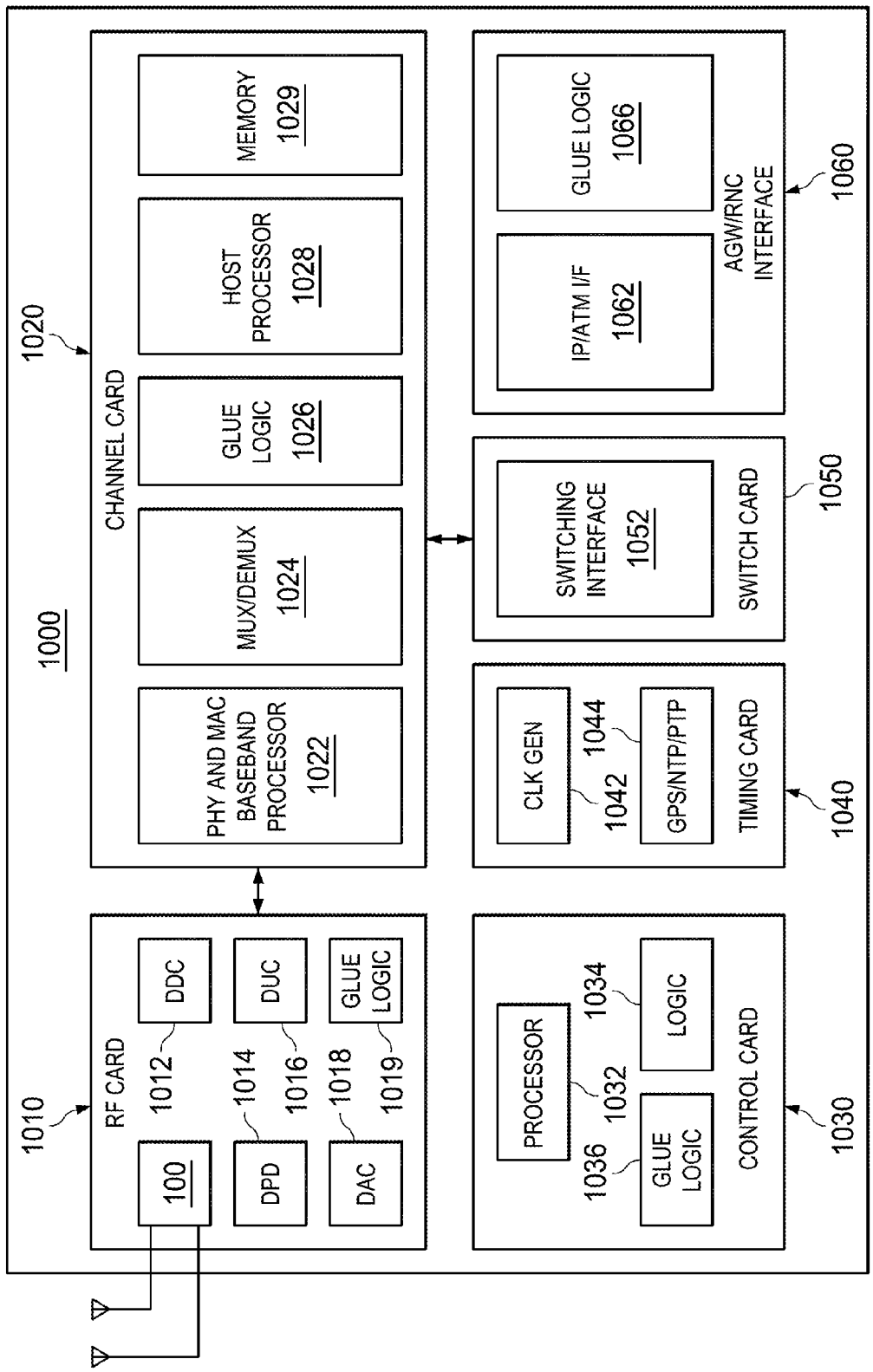
FIG. 10 is a block diagram of a wireless base station with CA capabilities, according to one or more examples of the present Specification.

FIG. 10 is a block diagram of a wireless base station 1000 according to one or more examples of the present Specification. Major subsystems of wireless base station 1000 include, in this example, an RF card 1010, a channel card 1020, a control card 1030, a timing card 1040, a switch card 1050, and a telephony interface card 1060.

RF card 1010 provides radio frequency signal conditioning and other related services, including in an example two-channel analog-to-digital conversion. To this end, RF card 1010 includes a super heterodyne receiver 100, as disclosed in FIG. 1. Alternatively, super heterodyne receiver 300 of FIG. 3 may be used. RF card 1010 also includes a digital downconverter (DDC) 1012. DDC 1012 may be used to perform the digital downconverter operations disclosed herein, as well as other downconverting operations. Digital upconverter (DUC) 1016 may perform the digital upconverter operations disclosed in the Specification, as well as other upconverting operations.

RF card 1010 also includes a digital pre-distortion (DPD) filter 1014. DPD 1014 may be used to filter signal distortion as described herein.

RF card 1010 also includes digital-to-analog converter (DAC) 1018. In an example, DDC 1012, DPD 1014, DUC 1016, and DAC 1018 may be provided internally as part of super heterodyne receiver 100. For example, DDC 1012 and DUC 1016 may be provided by RF mixers 140 and 340. In other embodiments, DDC 1012 and DUC 1016 may be provided as additional upconverter and downconverter functionality for RF card 1010. DPD may be provided in whole or in part by filters 130, 150, 330, 360, and/or 362. In other examples, DPD 1014 may provide additional or other filtering functionality. DAC 1018 may be provided in part by DAC 740 of FIG. 7, or may provide additional or other DAC functionality. It should thus be recognized that the disclosure of certain elements separate from super heterodyne receiver 100 is not intended to be limiting, but on the contrary is intended to demonstrate that RF card 1010 may include additional or supplemental functionality, or may rely wholly on functionality internal to super heterodyne receiver 100.

Finally, RF card 1010 includes glue logic 1019.

RF card 1010 may be communicatively coupled to a channel card 1020. In an example, communicative coupling is accomplished via common public radio interface (CPRI) or via a competing standard, such as open base station architecture initiative (OBSI). The use of a remote communication standard such as CPRI or OBSI allows channel card 1020 to be physically remote from RF card 1010 if necessary. Thus, in one embodiment, RF card 1010 may be directly, proximately, and physically coupled to channel card 1020, and in another embodiment, RF card 1010 may be remotely coupled, for example over a network or a wireless network, to channel card 1020.

Channel card 1020 includes a baseband processor for the physical (PHY) and media access control (MAC) layers of a communication protocol. Channel card 1020 may also include a multiplexer/demultiplexer 1024, and host processor 1028. Host processor 1028 may be any type of processor as described herein, and in some cases may be either a discrete and separate processor such as a digital signal processor or central processing unit, or may be part of an integrated circuit or part of a system-on-a-chip (SoC) implementation of channel card 1020. Host processor 1028 may be communicatively coupled to a memory 1029, which may have stored therein executable instructions operable to instruct host processor 1028 to carry out the functions of channel card 1020.

Base station 1000 also includes a control card 1030, which is configured to provide overall system control. Control card 1030 includes a processor 1032, which may be any type of processor, including a SoC processor. Logic 1034 may be provided to program processor 1032, and may be a memory, storage, ROM, or similar. In an example, logic 1034 includes instructions operable to instruct processor 1032 to carry out the functions of control card 1032. Glue logic 1036 is also provided on control card 1030.

A timing card 1040 is provided for precise timing control. Timing card 1040 includes a clock generator 1042, which in an example may provide clock signals to system components, including RF card 1010. In particular, in one example, timing card 1040 provides local oscillator signals LO1 and LO2 to super heterodyne receiver 100. Timing card 1040 may also include a precision time block 1044, which may be configured to receive signals including global positioning system (GPS), network time protocol (NTP), and precision time protocol (PTP). The functions of precision time block 1044 may be configured to provide extremely accurate and precise global time indicators. In some examples, high-precision time readings may account for very small variations, including network lag time and relativistic effects.

A switch card 1050 includes a switching interface 1052 communicatively coupled to channel card 1020.

A telephony interface card 1060 may provide access to a telephony network, for example via an access gateway (AGW) and/or radio network controller (RNC) protocols. Telephony interface card 1060 may include an interface card 1062 capable of handling protocols such as Internet protocol (IP) and asynchronous transfer mode (ATM). Thus, telephony network interface 1060 may provide a bridge between local communication on base station 1000 and a broader network such as the Internet or any other suitable network. Telephony interface card 1060 also includes glue logic 1066.

It should be recognized that although several "cards" are described within base station 1000 by way of non-limiting example, it is not intended for the Specification to be limited to separate or discrete cards. In one example, some or all of the "cards" described in reference to FIG. 10 may be provided as physically separate cards that interface with a backplane or other bus. In another example, the "cards" of FIG. 10 may be understood to be separate subsystems, which may all be provided as part of a single circuit board, or which may be provided as part of a SoC implementation. It should also be noted that certain functionalities of base station 1000 may be provided in duplicate, and in those cases, the duplicate functions may be combined in a single piece of physical hardware. For example, processor 1032 of control card 1030, and post-processor 1028 of channel card 1020 are disclosed by way of example as two physically-separate processors on two physically-separate cards. However, in some examples, both processor functionalities, in addition to the functionality of controller 480 of FIG. 4, may all be provided by a single processor, group of processors, or other arrangement. The boundaries and divisions disclosed in FIG. 10 are thus provided by way of example only, and are provided as logical divisions intended to facilitate discussion and explanation and to provide a useful frame of reference for discussing the disclosed functions, and are not intended to be limiting.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include a system on chip (SOC) central processing unit (CPU) package. An SOC represents an integrated circuit (IC) that integrates components of a computer or other electronic system into a single chip. It may contain digital, analog, mixed-signal, and radio frequency functions, all of which may be provided on a single chip substrate. Other embodiments may include a multi-chip-module (MCM), with a plurality of chips located within a single electronic package and configured to interact closely with each other through the electronic package. In various other embodiments, the digital signal processing functionalities may be implemented in one or more silicon cores in Application Specific Integrated Circuits (ASICs), Field Programmable Gate Arrays (FPGAs), and other semiconductor chips.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably-configured processor component can execute any type of instructions associated with the data to achieve the operations detailed herein, such as those provided by controller 480. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.'

Computer program logic implementing all or part of the functionality described herein is embodied in various forms, including, but in no way limited to, a source code form, a computer executable form, and various intermediate forms (for example, forms generated by an assembler, compiler, linker, or locator). In an example, source code includes a series of computer program instructions implemented in various programming languages, such as an object code, an assembly language, or a high-level language such as OpenCL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In the discussions of the embodiments above, the capacitors, buffers, interconnect boards, clocks, dividers, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the Specification, to limit this disclosure in any way that is not otherwise reflected in the appended claims.

What is claimed is:

1. A multiple-input analog-to-digital converter (ADC) comprising:
    a plurality of n receivers configured to receive n input bands;
    a combiner configured to combine at least two IF domain bands into a single IF domain input, wherein the combiner comprises:
        a first switch network configured to receive a first input signal from one of the n input bands;
        a second switch network configured to receive a second input signal from another of the n input bands;
        a first sampling capacitor network configured to receive the first input signal from the first switch network and convert the first input signal to a first charge domain input;

a second sampling capacitor network configured to receive the second input signal from the second switch network and convert the second input signal to a second charge domain input;

an amplifier configured to drive a single analog output; and a feedback capacitor network disposed in a feedback configuration with the amplifier and configured to receive the first and second charge domain inputs;

wherein the amplifier is further configured to convert the first and second charge domain inputs into the single analog output; and a converter element configured to convert the single IF domain input into a digital output.

2. The multiple-input analog-to-digital converter (ADC) of claim 1, wherein the n receivers are radio frequency (RF) receivers.

3. The multiple-input analog-to-digital converter (ADC) of claim 2, wherein n=2.

4. The multiple-input analog-to-digital converter (ADC) of claim 1, wherein the combiner further comprises at least one clear switch disposed parallel to at least one sample capacitor of the sample capacitor networks.

5. The multiple-input analog-to-digital converter (ADC) of claim 1, wherein the combiner further comprises a charge switch and a discharge switch, wherein the charge switch and discharge switch are configured to selectively permit the first and second sampling capacitor networks to charge and discharge.

6. The multiple-input analog-to-digital converter (ADC) of claim 1, further comprising a controller communicatively coupled to one or more switches and configured to control the switches.

7. The multiple-input analog-to-digital converter (ADC) of claim 1, further comprising an output switch connected across two output terminals of the amplifier.

8. A wireless base station comprising:
an antenna interface configured to receive at least two antenna inputs; and
a radio frequency subsystem communicatively coupled to the antenna interface, and including the multiple-input ADC of claim 1.

9. A combiner for a multiple-input analog-to-digital converter (ADC), comprising:
a first switch network configured to receive a first input signal from one of n input bands;
a second switch network configured to receive a second input signal from another of the n input bands;
a first sampling capacitor network configured to receive the first input signal from the first switch network and convert the first input signal to a first charge domain input;
a second sampling capacitor network configured to receive the second input signal from the second switch network and convert the second input signal to a second charge domain input;
an amplifier configured to drive a single analog output; and a feedback capacitor network disposed in a feedback configuration with the amplifier and configured to receive the first and second charge domain inputs;
wherein the amplifier is further configured to convert the first and second charge domain inputs into the single analog output.

10. The combiner of claim 9, further comprising at least one clear switch disposed parallel to at least one sample capacitor of the sample capacitor networks.

11. The combiner of claim 9, further comprising a charge switch and a discharge switch, wherein the charge switch and discharge switch are configured to selectively permit the first and second sampling capacitor networks to charge and discharge.

12. The combiner of claim 9, further comprising a controller communicatively coupled to one or more switches and configured to control the switches.

13. The combiner of claim 9, further comprising an output switch connected across two output terminals of the amplifier.

14. An integrated circuit comprising the combiner of claim 9.

15. The integrated circuit of claim 14, further comprising an analog-to-digital converter.

16. A wireless base station comprising:
an antenna interface configured to receive at least two antenna inputs;
a radio frequency subsystem communicatively coupled to the antenna interface, and including a multiple-input analog-to-digital converter comprising the combiner of claim 9.

17. A method performed by a multiple-input analog-to-digital converter comprising:
converting a voltage-domain analog input signal to a charge domain;
in the charge domain, charging a first sampling capacitor network and second sampling capacitor network;
in the charge domain, transferring charge from the first and second sampling capacitor networks to a feedback capacitor network disposed in a feedback arrangement with an amplifier; and
converting charge on the feedback capacitor network to a voltage-domain output signal.

18. The method of claim 17, further comprising amplifying the voltage-domain output signal to an amplified voltage-domain output signal.

19. The method of claim 17, wherein the frequency domain is a radio frequency domain.

20. The method of claim 17, wherein the frequency domain is an intermediate frequency domain.

21. The method of claim 18, further comprising converting the amplified voltage-domain output signal to a digital signal.

22. The multiple-input analog-to-digital converter (ADC) of claim 1, further comprising a mixer circuit configured to convert the n input bands to n intermediate frequency (IF) domain bands.

\* \* \* \* \*